(12) United States Patent
Feng et al.

(10) Patent No.: US 11,189,617 B2
(45) Date of Patent: Nov. 30, 2021

(54) GATE-ALL-AROUND DEVICES WITH REDUCED PARASITIC CAPACITANCE

(71) Applicant: QUALCOMM Incorporated, San Diego, CA (US)

(72) Inventors: Peijie Feng, San Diego, CA (US); Ye Lu, San Diego, CA (US); Junjing Bao, San Diego, CA (US); Chenjie Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/774,278

(22) Filed: Jan. 28, 2020

(65) Prior Publication Data

US 2021/0233911 A1    Jul. 29, 2021

(51) Int. Cl.
| H01L 27/12 | (2006.01) |
| H01L 29/06 | (2006.01) |
| H01L 29/66 | (2006.01) |
| H01L 29/08 | (2006.01) |
| H01L 29/423 | (2006.01) |
| H01L 29/10 | (2006.01) |
| H01L 27/092 | (2006.01) |
| H01L 29/49 | (2006.01) |

(Continued)

(52) U.S. Cl.
CPC ...... *H01L 27/0924* (2013.01); *H01L 21/0273* (2013.01); *H01L 21/02532* (2013.01); *H01L 21/30604* (2013.01); *H01L 21/31111* (2013.01); *H01L 21/31144* (2013.01); *H01L 21/823807* (2013.01); *H01L 21/823821* (2013.01); *H01L 21/823828* (2013.01); *H01L 29/0673* (2013.01); *H01L 29/0847* (2013.01); *H01L 29/1037* (2013.01); *H01L 29/42392* (2013.01); *H01L 29/4908* (2013.01)

(58) Field of Classification Search
CPC ............. H01L 21/8238; H01L 29/0673; H01L 21/823437; H01L 21/823462; H01L 21/82385
See application file for complete search history.

(56) References Cited

U.S. PATENT DOCUMENTS

2017/0213888 A1*  7/2017  Chang ................. H01L 29/0649
2017/0287788 A1* 10/2017  Doris ................. H01L 21/8238
(Continued)

FOREIGN PATENT DOCUMENTS

WO    2015094305 A1    6/2015

OTHER PUBLICATIONS

Loubet N., et al., "Stacked Nanosheet Gate-All-Around Transistor to Enable Scaling Beyond FinFET", Symposium on VLSI Technology Digest of Technical Papers, 2017, 2 Pages.

*Primary Examiner* — Brian Turner
(74) *Attorney, Agent, or Firm* — Patterson & Sheridan, LLP.

(57) ABSTRACT

Certain aspects of the present disclosure generally relate to a gate-all-around (GAA) semiconductor device. The GAA semiconductor device generally includes a substrate, a first nanosheet stack structure, a second nanosheet stack structure, the first and second nanosheet stack structures being disposed above a horizontal plane of the substrate and each comprising one or more nanosheet structures, and a dielectric structure disposed between the first nanosheet stack structure and the second nanosheet stack structure.

20 Claims, 7 Drawing Sheets

(51) Int. Cl.
  *H01L 21/02* (2006.01)
  *H01L 21/8238* (2006.01)
  *H01L 21/027* (2006.01)
  *H01L 21/311* (2006.01)
  *H01L 21/306* (2006.01)

(56) References Cited

U.S. PATENT DOCUMENTS

2018/0308766 A1* 10/2018 Mochizuki .......... H01L 29/0673
2019/0189776 A1*  6/2019 Chao ................. H01L 29/78696
2019/0393304 A1* 12/2019 Guillorn ............. H01L 21/0228
2020/0294863 A1*  9/2020 Chiang ........... H01L 21/823807

* cited by examiner

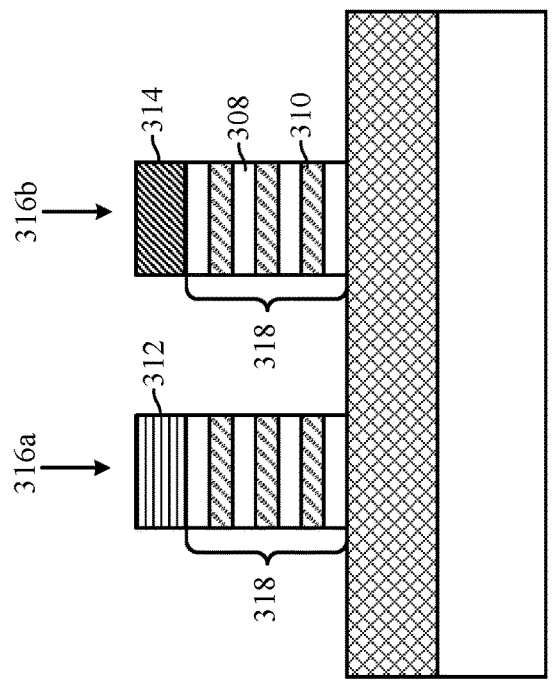
FIG. 3A
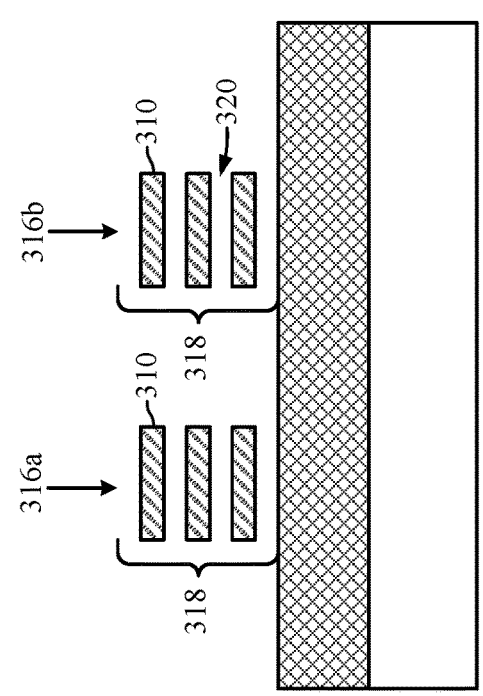
FIG. 3B
FIG. 3C
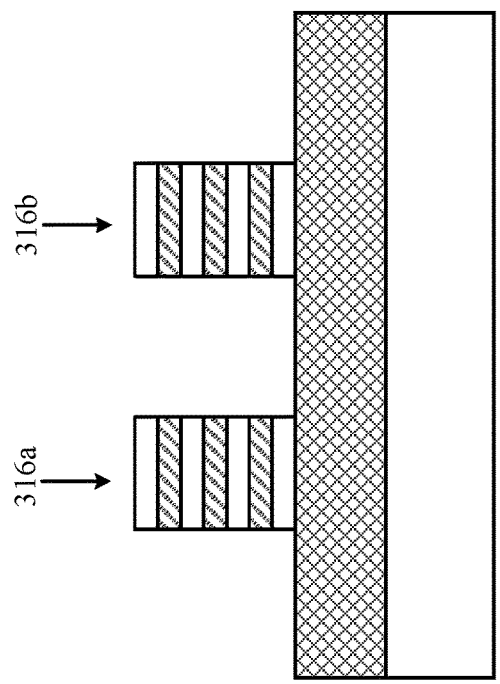
FIG. 3D

GATE-ALL-AROUND DEVICES WITH REDUCED PARASITIC CAPACITANCE

TECHNICAL FIELD

Certain aspects of the present disclosure generally relate to semiconductor devices and, more particularly, to techniques for reducing parasitic capacitance in gate-all-around (GAA) devices, such as GAA metal-oxide-semiconductor field-effect transistor (MOSFET) devices.

BACKGROUND

Advances in technology have resulted in smaller and more powerful computing devices. For example, a variety of portable personal computing devices—including wireless telephones such as mobile and smart phones, tablets, and laptop computers—are small, lightweight, and easily carried by users. These devices can communicate voice and data packets over wireless networks. Further, many such devices incorporate additional functionality such as a digital still camera, a digital video camera, a digital recorder, and an audio file player. Additionally, such devices can process executable instructions, including software applications, such as a web browser application, that can be used to access the Internet. As such, these devices can include significant computing capabilities.

Generally, computing devices use a large number of integrated circuits (ICs), such as transistors that may be used for processing logic and transistors used for memory devices. As computing devices continue to decrease in size, the footprint associated with transistors in various ICs tends to increase, relative to the size of the computing devices, unless the size of each transistor can be decreased. Fin field-effect transistor (FinFET) technology has been introduced to overcome this seeming footprint limitation. Fin-FETs are a type of metal-oxide-semiconductor FET (MOSFET) in which a gate structure is placed on two, three, or four sides of a channel structure, allowing for significantly faster switching times and higher current density than planar MOSFET technology. However, FinFET technology is facing critical scaling issues for sizes less than seven nanometers. Thus, multi-bridge-channel FET (MBCFET) technology, having a vertically stacked nanosheet (NS) and a gate-all-around (GAA) structure, has been developed to replace FinFETs in certain applications.

SUMMARY

Certain aspects of the present disclosure are generally directed to a GAA semiconductor device. The GAA semiconductor device generally includes a substrate, a first nanosheet stack structure, a second nanosheet stack structure, the first and second nanosheet stack structures being disposed above a horizontal plane of the substrate and each comprising one or more nanosheet structures, and a dielectric structure disposed between the first nanosheet stack structure and the second nanosheet stack structure.

Certain aspects of the present disclosure generally relate to a method for fabricating a GAA semiconductor device. The method generally includes forming a first nanosheet stack structure above a substrate, forming a second nanosheet stack structure above the substrate, each of the first and second nanosheet stack structures comprising one or more nanosheet structures, and forming a dielectric structure between the first nanosheet stack structure and the second nanosheet stack structure.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIGS. 3A-I illustrate example operations for fabricating a GAA semiconductor device, in accordance with certain aspects of the present disclosure.

DETAILED DESCRIPTION

Figure 1A:
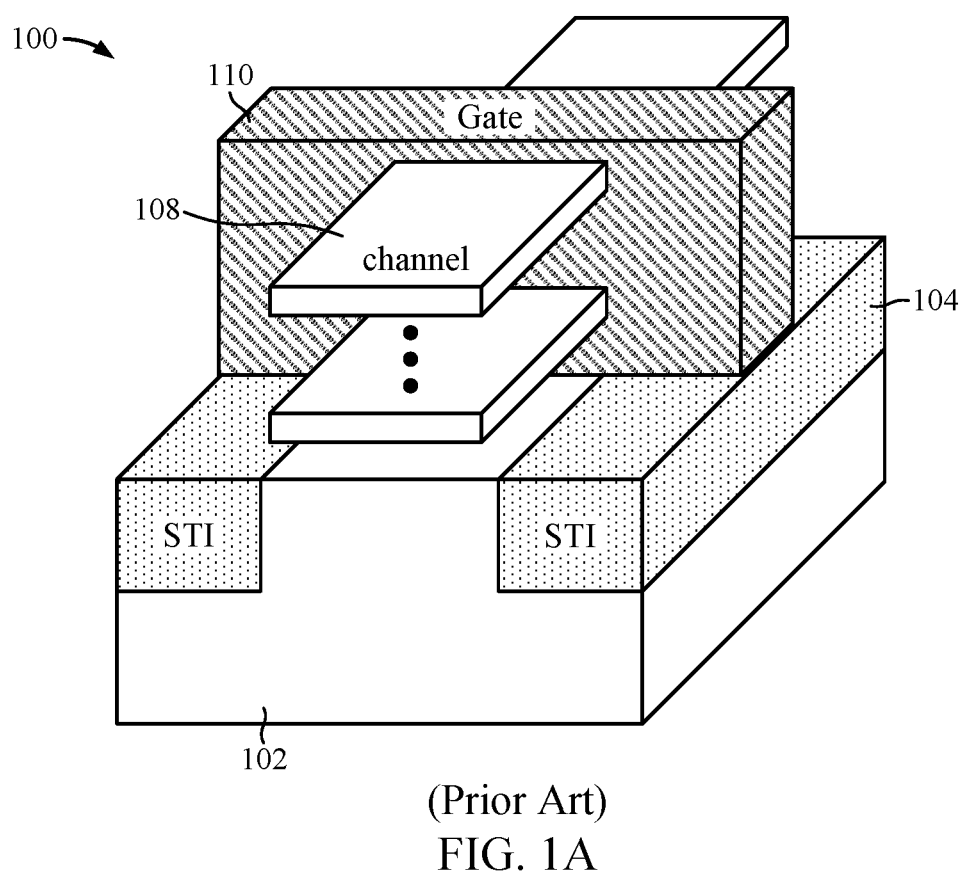
FIGS. 1A-1C illustrate a three-dimensional view, a frontal view of a two-dimensional cross-section, and a top view of a two-dimensional cross-section, respectively, of a conventional GAA semiconductor device.

Certain aspects of the present disclosure are generally directed to a gate-all-around (GAA) semiconductor device. The GAA semiconductor device generally includes a substrate, a first nanosheet stack structure, a second nanosheet stack structure, the first and second nanosheet stack structures being disposed above a horizontal plane of the substrate and each comprising one or more nanosheet structures, and a dielectric structure disposed between the first nanosheet stack structure and the second nanosheet stack structure.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Certain terminology may also be used in the following description for the purpose of reference only, and thus are not intended to be limiting. For example, terms such as "upper," "lower," "above," "below," "bottom," and "top" refer to directions in the drawings to which reference is made. Terms such as "front," "back," "rear," and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Example Conventional GAA Semiconductor Device

Fin field-effect transistor (FinFET) technology was introduced to overcome limitations associated with planar transistor technology. A FinFET is a type of non-planar or three-dimensional transistor that includes a structure that rises above the substrate and resembles a fin. The fin provides the semiconductor channel of the transistor between source and drain regions and is typically surrounded on three sides by a gate region, providing more control over the channel as compared to traditional planar designs. However, as transistors continue to scale down, FinFET technology meets difficulties. For example, as FinFET transistors continue to scale down, an effective width of the channel (e.g., fins) of the transistor decreases, leading to performance loss. In order to address this performance loss, one solution involves increasing the effective width of the channel. However, increasing the effective width of the channel decreases the transistor density (i.e., the number of transistors that may fit in a given area). In other words, with a larger channel width, less number of cells can fit in the given area.

Thus, in order to increase density and performance, multi-bridge-channel field-effect transistor (MBCFET) technology has been developed to replace FinFETs for sub-3-nm transistor technology in certain applications. MBCFETs include a number of vertically stacked nanosheet structures with a gate-all-around (GAA) structure, providing superior DC performance and better short channel control compared to FinFETs due to the uniform channel thickness.

Figure 1B:
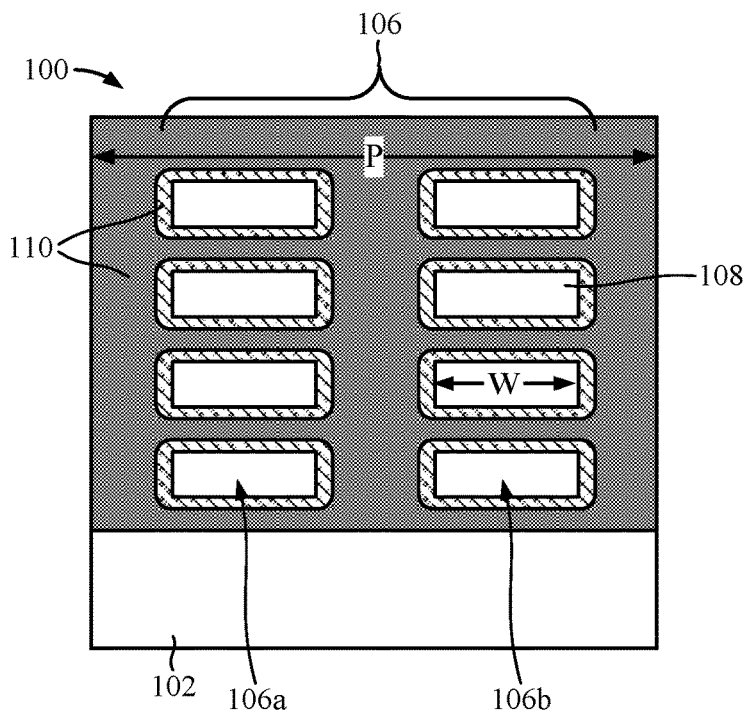
Figure 1C:
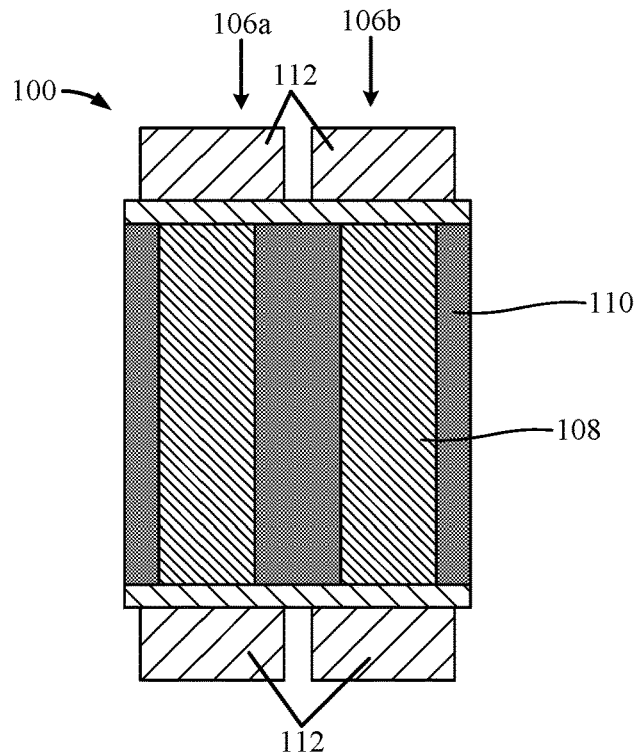

FIGS. 1A, 1B, and 1C illustrate a three-dimensional view, a frontal view of a two-dimensional cross-section, and a top view of a two-dimensional cross-section, respectively, of a conventional GAA semiconductor device 100. As illustrated, the GAA semiconductor device 100 may comprise a substrate layer 102. The substrate layer 102 may be a substrate employed in a semiconductor process, such as a silicon (Si) substrate or any other suitable material (e.g., glass, ceramic, aluminum oxide ($Al_2O_3$), etc.). FIG. 1B illustrates the cross-section of the substrate layer 102 as a plain rectangle in order to simplify the illustration, and is not intended to be limiting. For example, there may be other shapes and sizes of the substrate layer 102, as well as intervening layers.

Additionally, as illustrated in FIGS. 1B and 1C, the GAA semiconductor device 100 may include a plurality of nanosheet stack structures 106, each comprising a plurality of nanosheets 108 stacked vertically above the substrate layer 102. For example, as pictured in FIGS. 1B and 1C, the GAA semiconductor device 100 includes two nanosheet stack structures 106a and 106b. In some cases, each nanosheet stack structure of the nanosheet stack structures 106 may serve different functions and correspond to different types of transistor devices. For example, nanosheet stack structure 106a may be an n-type transistor device, whereas nanosheet stack structure 106b may be a p-type transistor device. In this case, FIGS. 1B and 1C illustrate a single GAA N/P MOS cell, such as for use in complementary metal-oxide-semiconductor (CMOS) devices where the gates of the NMOS and PMOS transistors are shorted together.

In certain cases, the effective width (labeled "W") of the nanosheets 108, or "channel," may be varied during design, allowing for density and performance of the GAA semiconductor device 100 to be altered. For example, in some cases, the effective width of the nanosheets 108 may be reduced (e.g., narrow), allowing more MBCFETs to fit in a given area of the GAA semiconductor device 100 (i.e., higher density). In other cases, the effective width of the nanosheets 108 may be increased (e.g., wide), providing the GAA semiconductor device 100 with high performance.

Each of the nanosheets 108 may be composed of a semiconductor material, such as silicon (Si), and form a channel between source/drain contacts 112 through which electrical current flow may be controlled, as shown in FIG. 1C. In order to control the electrical current flow through the channels, the nanosheets 108 may be surrounded by a gate structure 110. The gate structure 110 may comprise, for example, an electrically conducting material (e.g., a metal or metal alloy, such as tungsten (W), cobalt (Co), or a combination thereof) or a high dielectric constant (high-κ) and metal gate (HKMG) structure. The gate structure 110 may be known as a "gate" terminal and used to bias the semiconductor material of the channels to control the current flow.

Despite the main function of the gate structure 110, the gate structure 110 may produce certain negative effects in the GAA semiconductor device 100. For example, in certain cases, parasitic capacitance ($C_{parasitic}$) may exist between the gate structure 110 and the source/drain contacts 112 due to their relatively close proximity. This parasitic capacitance may affect performance of the GAA semiconductor device 100 by slowing down or delaying the GAA semiconductor device 100. For example, in some cases, the delay may be represented as $$C_{parasitic} * \frac{V}{I}$$

where V is voltage and I is current. Thus, given constant V and I, a larger $C_{parasitic}$ will cause larger delay and slower speed/frequency associated with the GAA semiconductor device 100.

Additionally, as illustrated in FIG. 1B, a GAA N/P MOS cell may be associated with a particular pitch (labeled "P"), which represents a width of the N/P MOS cell and represents the space occupied by the N/P MOS cell. Alternatively, in some cases, the pitch may be considered as the distance between the middle of one cell and the middle of an adjacent cell. Generally, the pitch may be fixed for design rule purposes; however, as noted above, the width of the nanosheets 108 (e.g., representing a channel width) may be varied in each nanosheet stack structure 106 for performance optimization. Nevertheless, as the width of the nanosheets 108 decreases, the area of the gate structure 110 filled between the nanosheet stack structures 106a and 106b increases, increasing the parasitic capacitance and reducing performance. For example, the gate structure 110 fill area may be represented as P-2*W, where P is the cell pitch and W is the width of the nanosheets 108 in the nanosheet stack structures 106, assuming the widths are the same. Thus, as the width of the nanosheets 108 decreases, the area of the gate structure 110 filled between the nanosheet stack structures 106 increases, leading to increased parasitic capacitance between the gate structure 110 and the source/drain contacts 112.

Therefore, aspects of the present disclosure provide techniques for reducing the parasitic capacitance within GAA semiconductor devices, such as in a GAA N/P MOS cell like the GAA semiconductor device 100. In some cases, techniques to reduce the parasitic capacitance in the GAA semiconductor device may involve depositing a dielectric material between adjacent nanosheet stack structures of the GAA semiconductor device. The dielectric material removes the capacitive coupling from the source/drain contacts to the gate structure 110 in the area with the dielectric material, thereby reducing parasitic capacitance and improving performance of the GAA semiconductor device.

Figure 2A:
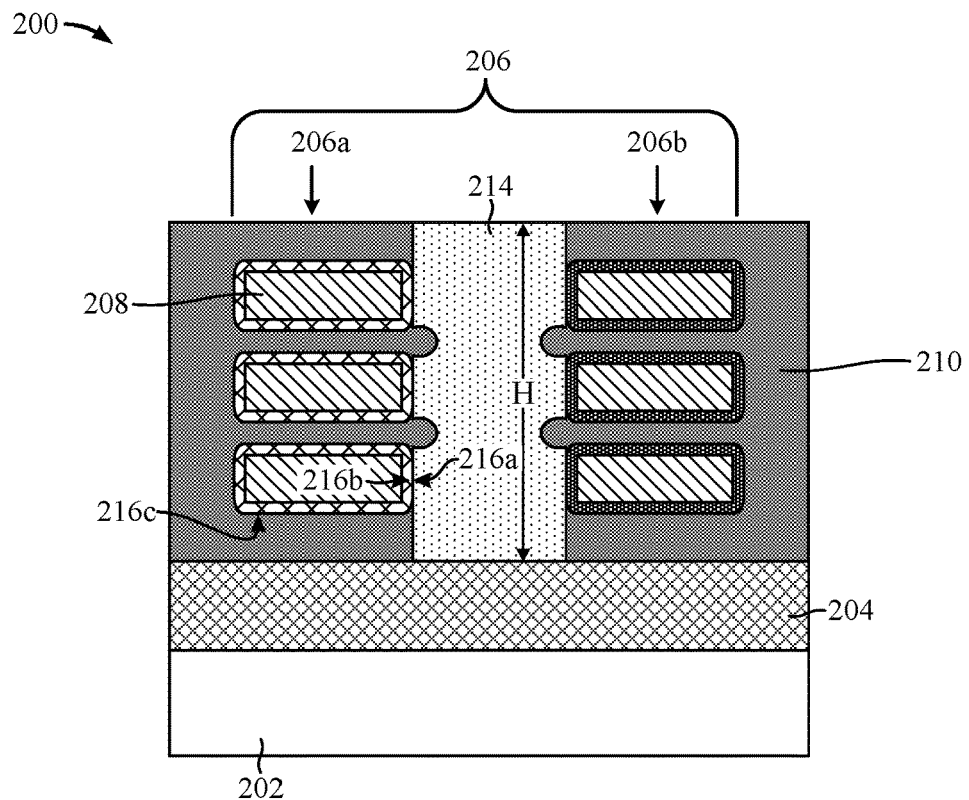
FIGS. 2A and 2B illustrate a frontal view and a top view, respectively, of cross-sections of a GAA semiconductor device, in accordance with certain aspects presented herein.
Figure 2B:
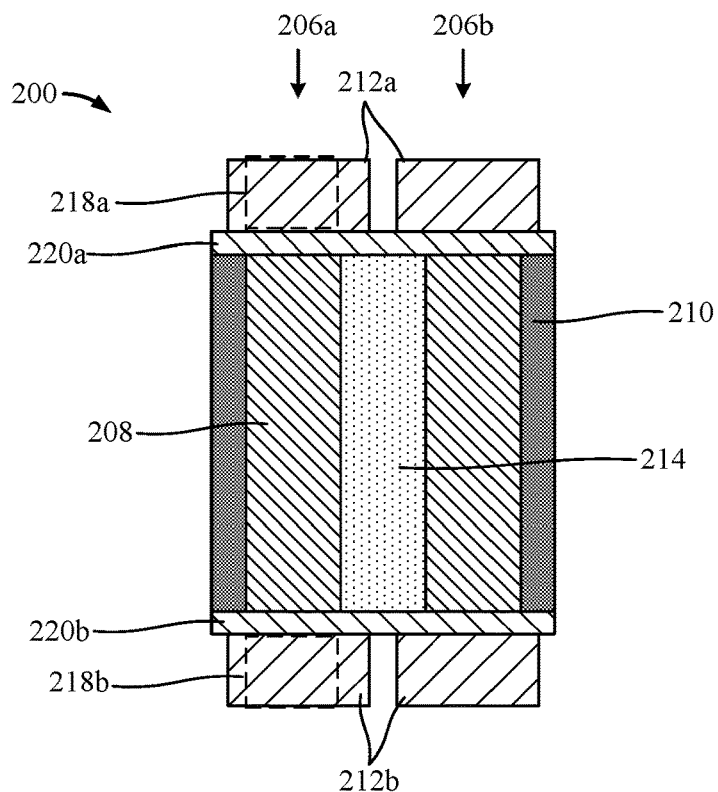

Example Techniques for Reducing Parasitic Capacitance in Gate-all-Around Devices FIGS. 2A and 2B illustrate a frontal view and a top view, respectively, of different cross-sections of a GAA semiconductor device 200 including a dielectric structure disposed between the nanosheet stack structures, in accordance with certain aspects presented herein. In some cases, the GAA semiconductor device 200 may be employed in various electrical devices, such as static random access memory (SRAM), to improve performance and/or memory density of such devices.

As illustrated, the GAA semiconductor device 200 may comprise a substrate layer 202. The substrate layer 202 may be a substrate employed in a semiconductor process, such as a silicon (Si) substrate or any other suitable material (e.g., glass, ceramic, aluminum oxide ($Al_2O_3$), etc.).

Additionally, as illustrated, the GAA semiconductor device 200 may include a plurality of nanosheet stack structures 206 disposed vertically/orthogonally above a horizontal plane of the substrate layer 202. As illustrated, the GAA semiconductor device 200 may include a first nanosheet stack structure 206a and a second nanosheet stack structure 206b. In some cases, the first nanosheet stack structure 206a and the second nanosheet stack structure 206b may correspond to different types of devices. For example, in some cases, the first nanosheet stack structure 206a corresponds to a p-type device, and the second nanosheet stack structure 206b corresponds to an n-type device or vice versa.

Further, as illustrated, the first nanosheet stack structure 206a and the second nanosheet stack structure 206b may be disposed above a horizontal plane of the substrate, and each may comprise one or more nanosheet structures 208, as explained below. It should be noted that while only two nanosheet stack structures 206 are shown, the GAA semiconductor device 200 may include any number of nanosheet stack structures 206, or at least any number of GAA N/P MOS cells, each comprising two different nanosheet stack structures.

Further, as noted, each nanosheet stack structure 206 (e.g., 206a and 206b) may include one or more nanosheet structures 208 that are stacked above the substrate layer 202 of the GAA semiconductor device 200. As noted above, the one or more nanosheet structures 208 form a channel between "source" and "drain" regions through which electrical current flow may be controlled. Additionally, source/drain contacts 212a, 212b may provide electrical contact to the source and drain regions through which electrical current flows.

Further, as shown, the GAA semiconductor device 200 may include an oxide layer 204 deposited above the substrate layer 202, separating the one or more nanosheet structures 208 from the substrate layer 202. According to aspects, the oxide layer 204 may be composed of any suitable oxide material, such as silicon dioxide ($SiO_2$), and may reduce parasitic capacitance between the one or more nanosheet structures 208 and the substrate layer 202 (e.g., as compared to the GAA semiconductor device 100 that lacks this oxide layer). In some cases, one or more of the nanosheet structures 208 may be deposited above the oxide layer 204, as illustrated.

As illustrated, the nanosheet structures 208 of each individual nanosheet stack structure 206 (e.g., 206a and 206b) may comprise a semiconductor channel structure surrounded by a work function metal. For example, the semiconductor channel structures of nanosheet stack structure 206a may be surrounded by an n-type work function metal, whereas the semiconductor channel structures of nanosheet stack structure 206b may be surrounded by a p-type work function metal. According to certain aspects, in some cases, the work function metal may be used to tune a threshold voltage associated with the semiconductor channel structures (e.g., a voltage at which electrical current flows through the semiconductor channel structures).

As illustrated, the one or more nanosheet structures 208 of nanosheet stack structures 206a and 206b may be surrounded on all sides by a gate structure 210. Similar to gate structure 110, the gate structure 210 may comprise, for example, an electrically conducting material (e.g., a metal or metal alloy, such as tungsten (W), cobalt (Co), or a combination thereof) or an HKMG structure. Further, as noted above, the gate structure 210 may serve as a gate terminal or region of the GAA semiconductor device 200, controlling current flow through the channel(s) created by the one or more nanosheet structures 208.

However, as noted above, since a parasitic capacitance may be induced between the gate structure 210 and source/drain contacts 212a, 212b, a dielectric structure 214 may be disposed between the nanosheet stack structures 206. The dielectric structure 214 may remove the capacitive coupling from the source/drain contacts 212a, 212b to the gate structure 210 in the area replaced by the dielectric structure 214, reducing parasitic capacitance and improving performance of the GAA semiconductor device 200, as compared to the GAA semiconductor device 100. While the dielectric structure 214 is shown as having a greater height (labeled "H" in FIG. 2A) than the plurality of nanosheet stack structures 206, in some cases, the height of the dielectric structure 214 may be the same as or less than the height of the plurality of nanosheet stack structures 206.

As illustrated, the dielectric structure 214 fills the space between the nanosheet stack structures 206. As such, lateral surfaces 216a of the dielectric structure 214 are coupled with a lateral surface 216b of each of the one or more nanosheet structures 208 of the first nanosheet stack structure 206a and the second nanosheet stack structure 206b. Accordingly, since the dielectric structure 214 is disposed between the first nanosheet stack structure 206a and the second nanosheet stack structure 206b, remaining lateral surfaces, such as 216c, of the one or more nanosheet structures 208 of the first nanosheet stack structure 206a and the second nanosheet stack structure 206b may be surrounded by a metal material, such as the gate structure 210. In other aspects, the dielectric structure 214 may not completely fill the volume between the nanosheet stack structures 206, but may still reduce the parasitic capacitance compared to the GAA semiconductor device 100.

In some cases, the metal material may primarily comprise tungsten, cobalt, copper, or a combination thereof. Further, in some cases, the dielectric structure 214 may primarily comprise a dielectric material such as silicon nitride ($Si_3N_4$), silicon carbide (SiC), silicon boron oxycarbide, silicon dioxide ($SiO_2$), or a combination thereof. Additionally, in some cases, the dielectric structure 214 may comprise at least one air gap.

In some cases, as illustrated in FIG. 2B, the GAA semiconductor device 200 may include a semiconductor source region (e.g., 218a of FIG. 2B) disposed adjacent a first end of the first nanosheet stack structure 206a and a semiconductor drain region (e.g., 218b of FIG. 2B) disposed adjacent a second end of the first nanosheet stack structure 206a. In some cases, the one or more nanosheet structures 208 of the first nanosheet stack structure 206a may extend axially between the source region 218a and the drain region 218b of the first nanosheet stack structure 206a. Likewise, as shown, the dielectric structure 214 may extend axially in parallel with the one or more nanosheet structures 208. It should be understood that the exact location of the source region and the drain region of the first nanosheet stack structure 206a shown in FIGS. 2A-2B is not intended to be limiting and that the source region and the drain region may be interchangeable based on different applications of the GAA semiconductor device 200.

In some cases, a spacer material may be disposed between either or both source/drain contacts 212 and the gate structure 210, for example, to provide electrical isolation therebetween. Additionally or alternatively, the spacer material may be disposed to surround the one or more nanosheet structures 208 at end portions thereof. For example, as illustrated in FIG. 2B, a first spacer 220a may be disposed between the source contact 212a and one edge of the gate structure 210 and a second spacer 220b may be disposed between the drain contact 212b and the other edge of the gate structure 210. In some cases, the spacers 220a, 220b may be composed of an insulating material, such as an oxide (e.g., silicon dioxide).

It should be noted that while a number of aspects presented above are described in reference to the first nanosheet stack structure, these aspects may apply equally to the second nanosheet stack structure 206b and any other nanosheet stack structures included in the GAA semiconductor device 200.

Figure 3E:
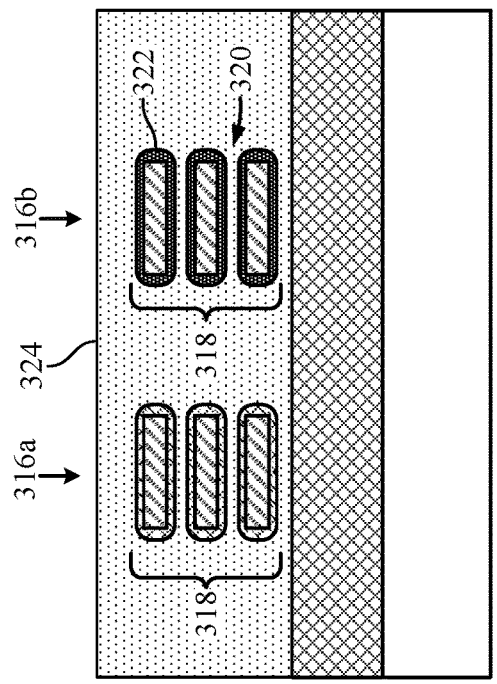

FIGS. 3A-I illustrate example operations for fabricating a GAA semiconductor device, such as the GAA semiconductor device 200, in accordance with certain aspects of the present disclosure. As illustrated in FIG. 3A, the operations may begin by forming or otherwise providing a substrate layer 302 and depositing an optional oxide layer 304 on the substrate layer 302. In some cases, the substrate layer 302 may come pre-fabricated and comprise any suitable semiconductor material, such as silicon. Additionally, the oxide layer 304 may comprise any suitable oxide material, such as silicon dioxide. An epitaxial structure 306 may then be epitaxially grown above the oxide layer 304. As illustrated, the epitaxial structure 306 may comprise a plurality of alternating layers 308 and 310, which will later become the one or more nanosheets of the GAA semiconductor device 200. In some cases, the layers 308 may comprise a semiconductor material, such as germanium (Ge) or silicon germanium (SiGe). Additionally, in some cases, the layers 310 may comprise a semiconductor material, such as silicon (Si).

According to aspects, as illustrated in FIG. 3A, a first photoresist mask 312 and a second photoresist mask 314 may be deposited on the epitaxial structure 306. The first photoresist mask 312 may be deposited on a location of the epitaxial structure 306 that corresponds (or will correspond) to a first nanosheet stack structure, such as the first nanosheet stack structure 206a. Likewise, the second photoresist mask 314 may be deposited on a location of the epitaxial structure 306 that corresponds (or will correspond) to a second nanosheet stack structure, such as a the second nanosheet stack structure 206b.

As illustrated in FIG. 3B, portions of the layers 308 and 310 of the epitaxial structure 306 may then be removed (e.g., etched) from unprotected areas of the epitaxial structure 306 down to the oxide layer 304. For example, portions of the layers 308 and 310 not located under the first photoresist mask 312 and the second photoresist mask 314 may be removed down to the oxide layer 304, forming a first nanosheet stack structure 316a and a second nanosheet stack structure 316b each comprising a plurality of nanosheets 318 corresponding to layers 308 and 310.

Thereafter, as illustrated in FIG. 3C, the first photoresist mask 312 and the second photoresist mask 314 may be removed from the first nanosheet stack structure 316a and the second nanosheet stack structure 316b, respectively.

Thereafter, as illustrated in FIG. 3D, nanosheets corresponding to layers 308 (e.g., the Ge or SiGe layers) in nanosheets 318 of the first nanosheet stack structure 316a and the second nanosheet stack structure 316b may be selectively removed (e.g., etched), leaving nanosheets corresponding to layers 310 (e.g., Si layers) in the nanosheets 318 of the first nanosheet stack structure 316a and the second nanosheet stack structure 316b intact. In some cases, the nanosheets corresponding to layers 308 (e.g., the Ge or SiGe layers) in nanosheets 318 of the first nanosheet stack structure 316a and second nanosheet stack structure 316b may be removed (e.g., etched) using tetramethyl ammonium hydroxide ($C_4H_{13}NO$). As illustrated, after the nanosheets corresponding to layers 308 in nanosheets 318 of the first nanosheet stack structure 316a and the second nanosheet stack structure 316b are removed (e.g., etched), the nanosheets 318 may comprise only nanosheets corresponding to layers 310 (e.g., only Si layers). As illustrated in FIG. 3D, the nanosheets corresponding to layers 310 in nanosheets 318 may be separated by an air gap 320 from each other.

Thereafter, as illustrated in FIG. 3E, a work function metal 322 may be conformably grown on all sides on the nanosheets 318 of the first nanosheet stack structure 316a and the second nanosheet stack structure 316b. In some cases, different types of work function metals may be grown on the nanosheets 318 of the first nanosheet stack structure 316a as compared to the nanosheets 318 of the second nanosheet stack structure 316b. For example, in some cases, as noted above, nanosheets 318 of the nanosheet stack structure 316a may be surrounded by an n-type work function metal, whereas the nanosheets 318 of the nanosheet stack structure 316b may be surrounded by a p-type work function metal.

Figure 3F:
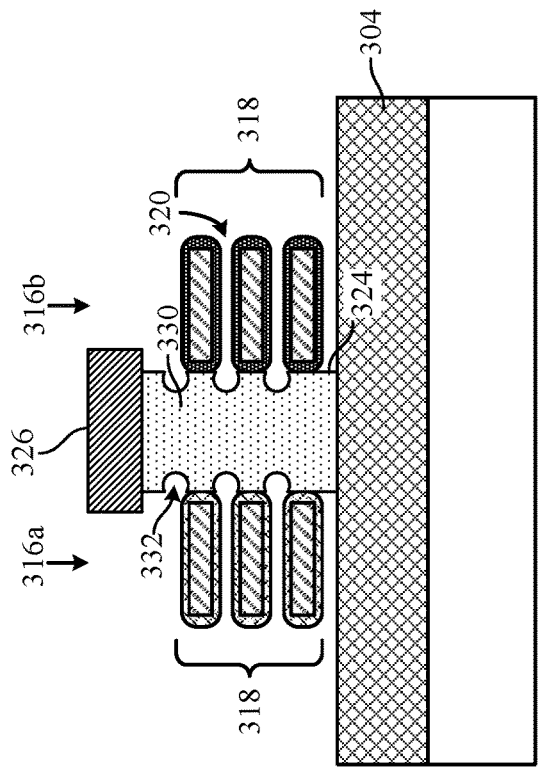

Thereafter, as illustrated in FIG. 3F, a dielectric material layer 324 may be conformably grown/deposited around the work function metal 322 and nanosheets 318 of the first nanosheet stack structure 316a and the second nanosheet stack structure 316b, filling in the air gaps 320. As illustrated, the dielectric material layer 324 may be grown/deposited to a greater height than the first nanosheet stack structure 316a and the second nanosheet stack structure 316b. As noted above, in certain cases (not illustrated), the dielectric material layer 324 may be grown/deposited to the same or a lower height than that of the first nanosheet stack structure 316a and the second nanosheet stack structure 316b.

Figure 3G:
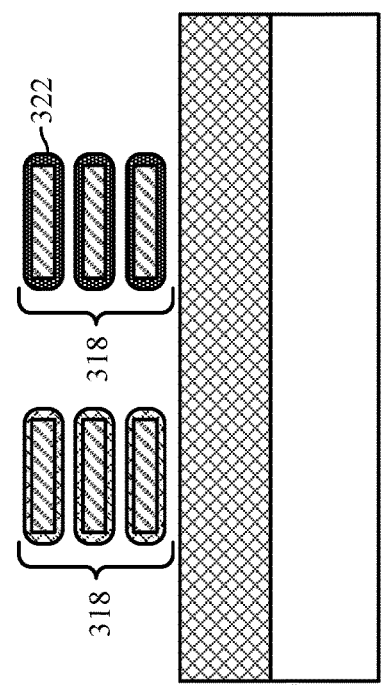

Thereafter, as illustrated in FIG. 3G, a hard mask layer 326 (e.g., such as a photoresist mask comprising $Si_3N_4$) may be deposited on the dielectric material layer 324, covering an area 328, or at least a portion of the area 328, of the dielectric material layer 324 between the first nanosheet stack structure 316a and the second nanosheet stack structure 316b.

Figure 3H:
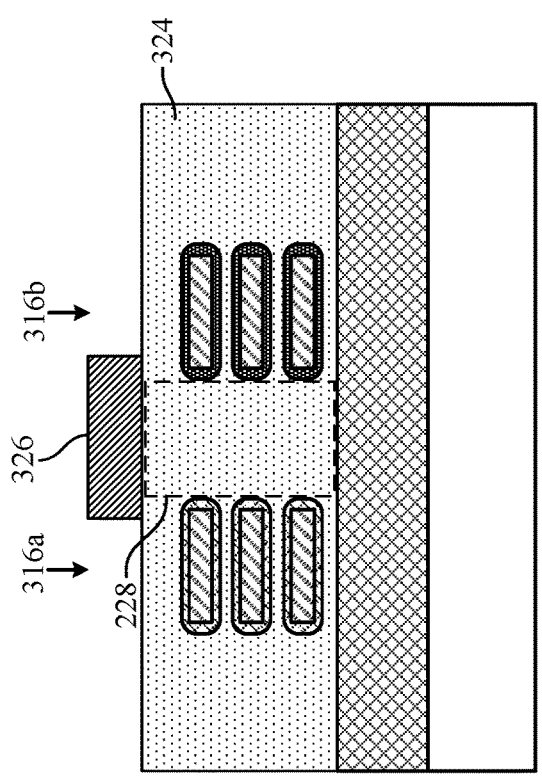

Thereafter, as illustrated in FIG. 3H, anisotropic etching may be performed to remove portions of the dielectric material layer 324 not protected by the hard mask layer 326, forming a dielectric structure 330. For example, as illustrated, the anisotropic etching may remove portions of the dielectric material layer 324 on either side of the hard mask layer 326 down to the oxide layer 304, including portions of the dielectric material layer 324 in between the nanosheets 318 of each of the first nanosheet stack structure 316a and the second nanosheet stack structure 316b (e.g., portions corresponding to the air gaps 320). In some cases, as illustrated, the anisotropic etching may over etch slightly into the area of the dielectric material layer 324 under the hard mask layer 326 as shown at 332; however, most of the dielectric material layer 324 under the hard mask layer 326 will remain.

As noted, the anisotropic etching may result in the formation of the dielectric structure 330. Further as noted above, the dielectric structure 330 may serve to reduce parasitic capacitance in the GAA semiconductor device 200 (e.g., usually caused between source/drain contacts and a gate structure, as explained above with reference to FIG. 1). As noted, reducing the parasitic capacitance of the GAA semiconductor device 200 may result in increased speed and performance.

Figure 3I:
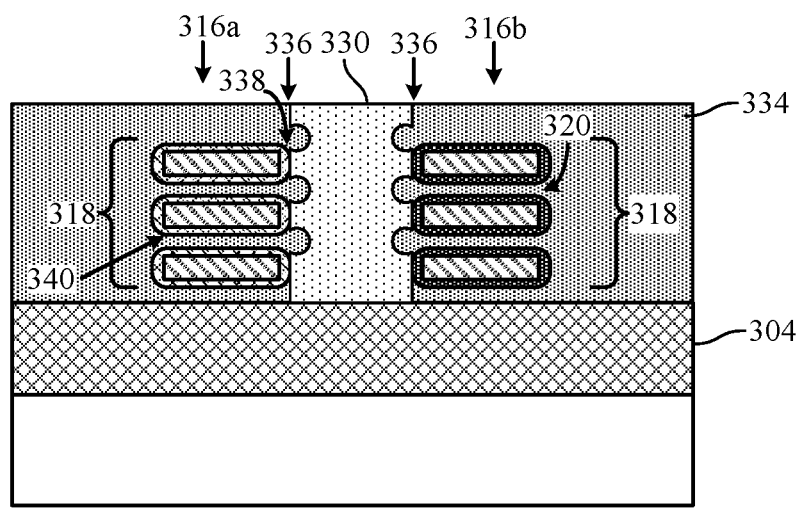

Thereafter, as illustrated in FIG. 3I, the hard mask layer 326 may be removed, and a metal fill material 334 may be deposited on the oxide layer 304 on either side of the dielectric structure 330, filling in the air gaps 320 between nanosheets 318 of the first nanosheet stack structure 316a and the second nanosheet stack structure 316b. In some cases, as noted above, the metal fill material 334 (e.g., which may be an HKMG material) may be composed of a conducting material, such as tungsten (W), copper (Cu), cobalt (Co), or a combination thereof.

As illustrated, lateral surfaces 336 of the dielectric structure 330 are coupled with a lateral surface 338 of each of the nanosheets 318 of the first nanosheet stack structure 316a and the second nanosheet stack structure 316b. Accordingly, since the dielectric structure 330 is disposed between the first nanosheet stack structure 316a and the second nanosheet stack structure 316b, remaining lateral surfaces, such as surface 340, of the nanosheets 318 of the first nanosheet stack structure 316a and the second nanosheet stack structure 316b may be surrounded by the metal fill material 334.

Figure 4:
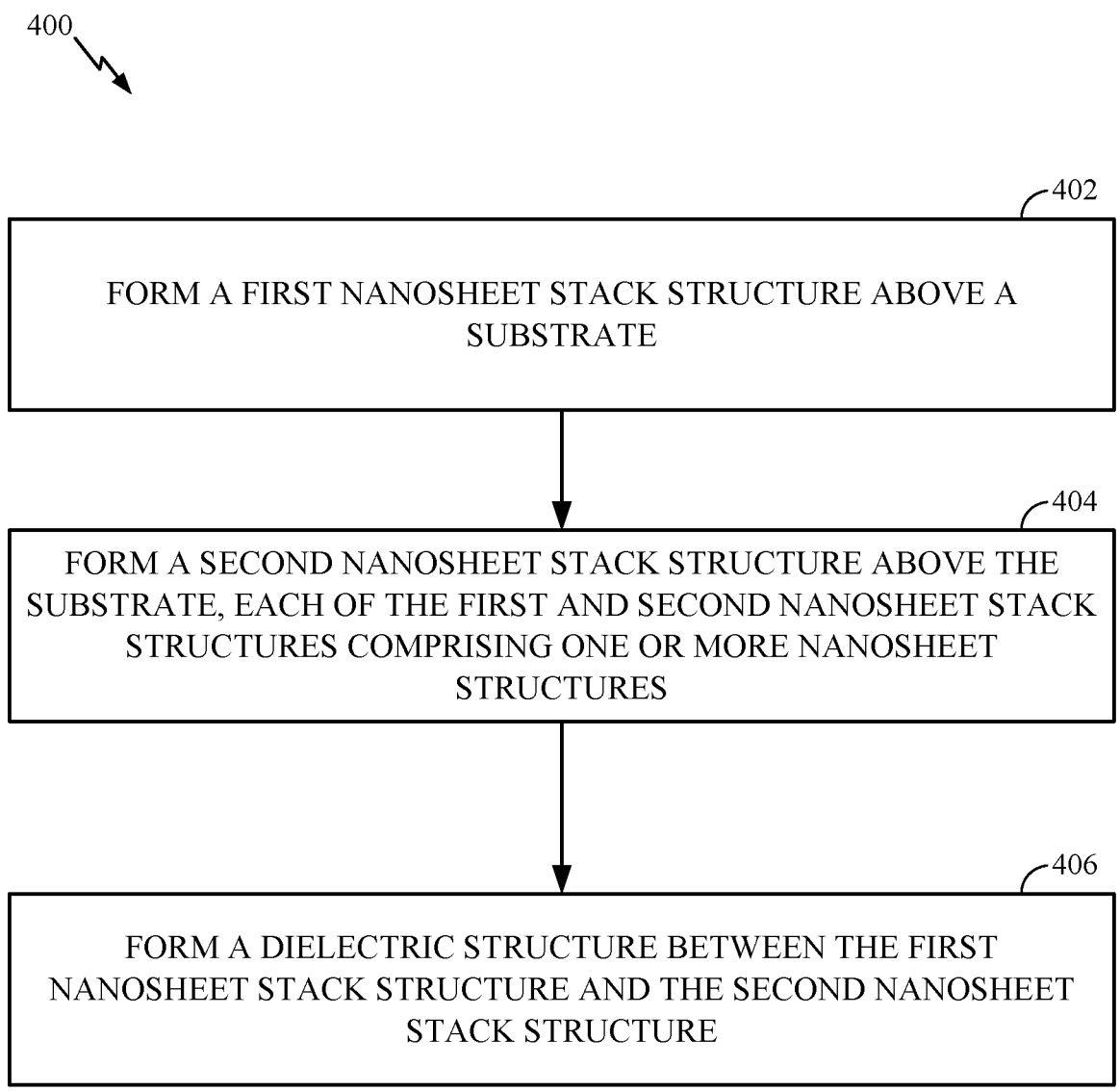
FIG. 4 is a flow diagram illustrating example operations for fabricating a GAA semiconductor device, in accordance with certain aspects of the present disclosure.

FIG. 4 is a flow diagram illustrating example operations 400 for fabricating a GAA semiconductor device, in accordance with certain aspects of the present disclosure. The operations 400 may be performed, for example, by a semiconductor processing facility.

The operations 400 begin, at block 402, with the semiconductor processing facility forming a first nanosheet stack structure above a substrate.

At block 404, the semiconductor processing facility forms a second nanosheet stack structure above the substrate. The first and second nanosheet stack structures are disposed above a horizontal plane of the substrate, and each nanosheet stack structure comprises one or more nanosheet structures.

At block 406, the semiconductor processing facility forms a dielectric structure between the first nanosheet stack structure and the second nanosheet stack structure.

As noted above, in some cases, lateral surfaces of the dielectric structure are coupled with a lateral surface of each of the one or more nanosheet structures of the first nanosheet stack structure and the second nanosheet stack structure. Further, in some cases, a metal material surrounds remaining lateral surfaces of the one or more nanosheet structures of the first nanosheet stack structure and the second nanosheet stack structure. Further, in some cases, the metal material primarily comprises tungsten, copper, or a combination thereof. Additionally, in some cases, the dielectric structure primarily comprises silicon nitride, silicon carbide, silicon boron oxycarbide, silicon dioxide, or a combination thereof.

Further, in some cases, the first nanosheet stack structure corresponds to a p-type device, and the second nanosheet stack structure corresponds to an n-type device.

Further, in some cases, the one or more nanosheet structures each comprise a semiconductor channel structure (e.g., an individual nanosheet) surrounded by a work function metal (e.g., a p-type or n-type work function metal).

Further in some cases, a semiconductor source region may be disposed adjacent a first end of the first nanosheet stack structure, and a semiconductor drain region may be disposed adjacent a second end of the first nanosheet stack structure. Additionally, in some cases, the one or more nanosheets extend axially between the source region and the drain region of the first nanosheet stack structure, and the dielectric structure extends axially in parallel with the one or more nanosheets.

Additionally, in some cases, the one or more nanosheet structures of the first nanosheet structure comprise a plurality of nanosheet structures, wherein the plurality of nanosheet structures are stacked vertically. A height of the dielectric structure may be greater than, less than, or the same as a height of the plurality of nanosheet structures.

Further, in some cases, forming the dielectric structure may include forming an oxide layer above (e.g., on top of) the substrate.

Additionally, in some cases, forming the dielectric structure may include growing an epitaxial structure above (e.g., on top of) the oxide layer, wherein the epitaxial structure comprises a plurality of alternating epitaxial layers of differing materials. For example, in some cases, a first layer of the plurality of alternating epitaxial layers may comprise a layer of silicon. Additionally, in some cases, a second layer of the plurality of alternating epitaxial layers may comprise a layer of germanium or silicon germanium. According to aspects, the first layer and the second layer may be repeated throughout the epitaxial structure.

Further, in some cases, forming the dielectric structure may include depositing a first photoresist mask and a second photoresist mask above (e.g., on top of) the epitaxial structure. In some cases, the first photo-resist layer may be deposited on a location of the epitaxial structure corresponding to the first nanosheet stack structure. Likewise, the second photo-resist layer may be deposited on a location of the epitaxial structure corresponding to the second nanosheet stack structure.

Further, in some cases, forming the dielectric structure may include removing (e.g., etching) the first layers and second layers of the plurality of alternating epitaxial layers of the epitaxial structure from unprotected areas (e.g., areas not underneath the first photoresist layer or second photoresist layer) of the epitaxial structure down to the oxide layer, forming the first nanosheet stack structure and the second nanosheet stack structure.

Further, in some cases, forming the dielectric structure may include removing the first photo-resist mask and a second photo-resist mask from the first nanosheet stack structure and the second nanosheet stack structure, respectively.

Further, in some cases, forming the dielectric structure may include selectively removing (e.g., etching) the second layers corresponding to the first nanosheet stack structure and the second nanosheet stack structure, leaving one or more nanosheets corresponding to the first nanosheet stack structure and the second nanosheet stack structure. For example, as noted above, the second layers may comprise a semiconductor material such as germanium or silicon germanium. In some cases, removing the second layers may comprise using tetramethyl ammonium hydroxide ($C_4H_{13}NO$) to remove the second layers.

Further, in some cases, forming the dielectric structure may include a conformably growing/depositing a dielectric material layer around the one or more nanosheets of the first nanosheet stack structure and the second nanosheet stack structure.

Further, in some cases, forming the dielectric structure may include depositing a hard mask layer (e.g., such as a photoresist mask) on the dielectric material layer, covering an area of the dielectric material layer between the first nanosheet stack structure and the second nanosheet stack structure.

Further, in some cases, forming the dielectric structure may include forming a dielectric structure between the first nanosheet stack structure and the second nanosheet stack structure by performing anisotropic etch to remove portions of the dielectric material layer not protected by the hard mask layer down to the oxide layer.

Further, in some cases, forming the dielectric structure may include removing the hard mask layer and depositing a metal fill material on the oxide layer on either side of the dielectric structure, surrounding the one or more nanosheets of the first nanosheet stack structure and the second nanosheet stack structure.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A gate-all-around (GAA) semiconductor device, comprising:
   a substrate;
   a first nanosheet stack structure;
   a second nanosheet stack structure, the first and second nanosheet stack structures being disposed above a horizontal plane of the substrate and each comprising one or more nanosheet structures; and
   a dielectric structure disposed between the first nanosheet stack structure and the second nanosheet stack structure, wherein:
      lateral surfaces of the dielectric structure are coupled with a lateral surface of each of the one or more nanosheet structures of the first nanosheet stack structure and the second nanosheet stack structure; and
      a metal material surrounds remaining lateral surfaces of the one or more nanosheet structures of at least one of the first nanosheet stack structure or the second nanosheet stack structure.

2. The GAA semiconductor device of claim 1, wherein the metal material primarily comprises tungsten, copper, or a combination thereof.

3. The GAA semiconductor device of claim 1, wherein the dielectric structure primarily comprises silicon nitride, silicon carbide, silicon boron oxycarbide, silicon dioxide, or a combination thereof.

4. The GAA semiconductor device of claim 1, wherein:
the first nanosheet stack structure corresponds to a p-type device; and
the second nanosheet stack structure corresponds to an n-type device.

5. The GAA semiconductor device of claim 1, wherein the one or more nanosheet structures each comprise a semiconductor channel structure surrounded by a work function metal.

6. The GAA semiconductor device of claim 1, further comprising:
a semiconductor source region disposed adjacent a first end of the first nanosheet stack structure; and
a semiconductor drain region disposed adjacent a second end of the first nanosheet stack structure, wherein the one or more nanosheet structures extend axially between the source region and the drain region of the first nanosheet stack structure and wherein the dielectric structure extends axially in parallel with the one or more nanosheet structures.

7. The GAA semiconductor device of claim 6, further comprising:
a first spacer disposed between the source region and the first end of the first nanosheet stack structure; and
a second spacer disposed between the drain region and the second end of the first nanosheet stack structure.

8. The GAA semiconductor device of claim 1, wherein the one or more nanosheet structures of the first nanosheet stack structure comprise a plurality of nanosheet structures, wherein the plurality of nanosheet structures are stacked vertically, and wherein a height of the dielectric structure is greater than a height of the plurality of nanosheet structures.

9. The GAA semiconductor device of claim 1, wherein:
the dielectric layer does not overlap the first nanosheet stack structure; and
the dielectric layer does not overlap the second nanosheet stack structure.

10. The GAA semiconductor device of claim 1, wherein:
the dielectric layer includes one or more well structures located between the one or more nanosheet structures of the first nanosheet stack structure and the second nanosheet stack structure; and
the one or more well structures are composed of the metal material.

11. The GAA semiconductor device of claim 1, wherein one of:
a height of the dielectric structure is less than a height of the first nanosheet stack structure and the second nanosheet stack structure; or
a height of the dielectric structure is approximately equal to a height of the first nanosheet stack structure and the second nanosheet stack structure.

12. The GAA semiconductor device of claim 1, wherein the dielectric structure comprises an air gap.

13. A method for fabricating a gate-all-around (GAA) semiconductor device, comprising:
forming a first nanosheet stack structure above a substrate;
forming a second nanosheet stack structure above the substrate, each of the first and second nanosheet stack structures comprising one or more nanosheet structures;
forming a dielectric structure between the first nanosheet stack structure and the second nanosheet stack structure, wherein lateral surfaces of the dielectric structure are coupled with a lateral surface of each of the one or more nanosheet structures of the first nanosheet stack structure and the second nanosheet stack structure; and
forming a metal material surrounding remaining lateral surfaces of the one or more nanosheet structures of at least one of the first nanosheet stack structure or the second nanosheet stack structure.

14. The method of claim 13, wherein the metal material primarily comprises tungsten, copper, or a combination thereof.

15. The method of claim 13, wherein the dielectric structure primarily comprises silicon nitride, silicon carbide, silicon boron oxycarbide, silicon dioxide, or a combination thereof.

16. The method of claim 13, wherein forming the dielectric structure comprises:
growing an epitaxial structure above an oxide layer disposed above the substrate, wherein the epitaxial structure comprises a plurality of alternating epitaxial layers of differing materials, wherein the plurality of alternating epitaxial layers comprises at least first layers and second layers;
depositing a first photoresist mask above the epitaxial structure on a location of the epitaxial structure corresponding to the first nanosheet stack structure;
depositing a second photoresist mask above the epitaxial structure on a location of the epitaxial structure corresponding to the second nanosheet stack structure;
etching, down to the oxide layer, portions of the plurality of alternating epitaxial layers of the epitaxial structure not located underneath either of the first photoresist mask or the second photoresist mask, forming the first nanosheet stack structure and the second nanosheet stack structure; and
selectively removing the second layers of the plurality of alternating epitaxial layers corresponding to the first nanosheet stack structure and the second nanosheet stack structure, leaving one or more nanosheets corresponding to the first nanosheet stack structure and the second nanosheet stack structure.

17. The method of claim 16, wherein forming the dielectric structure further comprises conformably growing a dielectric material layer around the one or more nanosheets corresponding to the first nanosheet stack structure and the second nanosheet stack structure.

18. The method of claim 17, wherein forming the dielectric structure further comprises depositing a hard mask layer on the dielectric material layer, covering at least a portion of an area of the dielectric material layer between the first nanosheet stack structure and the second nanosheet stack structure.

19. The method of claim 18, wherein forming the dielectric structure further comprises performing anisotropic etching to remove portions of the dielectric material layer not protected by the hard mask layer down to the oxide layer.

20. The method of claim 19, wherein forming the dielectric structure further comprises:
removing the hard mask layer; and
depositing a metal fill material on the oxide layer on either side of the dielectric structure, surrounding the one or more nanosheets corresponding to the first nanosheet stack structure and the second nanosheet stack structure.

* * * * *